United States Patent
Stengel et al.

(10) Patent No.: US 7,102,429 B2
(45) Date of Patent: Sep. 5, 2006

(54) RF AMPLIFIER WITH ENHANCED EFFICIENCY

(75) Inventors: Robert E. Stengel, Pompano Beach, FL (US); Scott A. Olson, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 647 days.

(21) Appl. No.: 10/184,742

(22) Filed: Jun. 28, 2002

(65) Prior Publication Data

US 2004/0000948 A1 Jan. 1, 2004

(51) Int. Cl.
*H03G 3/20* (2006.01)

(52) U.S. Cl. .......................... 330/136; 330/10; 330/302
(58) Field of Classification Search ................. 330/136, 330/10, 302
See application file for complete search history.

(56) References Cited

U.S. PATENT DOCUMENTS 4,081,622 A * 3/1978 Clark et al. ................. 379/395
4,353,100 A * 10/1982 Inoue .......................... 360/65
6,281,748 B1 * 8/2001 Klomsdorf et al. ......... 330/129
6,566,944 B1 * 5/2003 Pehlke et al. ................. 330/10

* cited by examiner

*Primary Examiner*—Patricia Nguyen (57) ABSTRACT

A high efficiency amplifier arrangement consistent with certain embodiments of the invention has an amplifier (104) that receives an input signal and amplifies the input signal to produce an output signal that drives a load (108). A variable impedance transformer (300) is disposed between the amplifier (104) and the load (108) to presents a varying load impedance to the output of the amplifier (104). A control mechanism, such as a programmed processor (604, 504), controls the variable impedance transformer (300) with a control signal so that the load impedance seen by the amplifier (104) varies in accordance with an envelope of the input signal. The control signal varies the load impedance in a manner that keeps the output of the amplifier (104) near a peak value. The arrangement may further include a circuit for controlling a DC input bias (420) of the amplifier (104) to keep the amplifier (104) operating within a predetermined class of operation throughout a range of input signals. The control signal may be calculated, looked up in a lookup table (610) or derived from an envelope detector (404).

34 Claims, 6 Drawing Sheets

RF AMPLIFIER WITH ENHANCED EFFICIENCY

FIELD OF THE INVENTION

This invention relates generally to the field of radio frequency (RF) amplifiers. More particularly, this invention relates to enhancement of efficiency of RF amplifiers.

BACKGROUND OF THE INVENTION

With the proliferation of battery powered wireless communication devices, it is generally desirable to maximize information throughput. As a result, wireless communications systems with maximized information rate per unit Hertz of spectrum are resulting in higher ranges of RF signal amplitude modulation. Statistical values of the amplitude modulation result in two parameters, peak and average output power ratio. The average power determines in part the wireless product's communication range. Peak power and peak-to-average power define the RF power amplifier amplitude requirements and the average DC to RF conversion efficiency for a standard linear amplifier. As the peak-to-average power ratio increases the information rate per unit Hertz can also be increased. However, an increased peak-to-average power ratio serves to decrease the DC to RF conversion efficiency of an RF amplifier resulting in shorter batter life. This is generally undesirable in a portable RF communication device since it directly translates to shorter time between charges or battery replacement.

BRIEF DESCRIPTION OF THE DRAWINGS

The features of the invention believed to be novel arc set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The present invention, in certain embodiments, improves DC to RF conversion efficiency of an amplitude varied RF power amplifier by applying a load modulation at the output of a constant RF carrier voltage source. In certain embodiments, this efficiency is further enhanced by modulation of the DC bias at the RF amplifier input to maximize efficiency.

Figure 1:
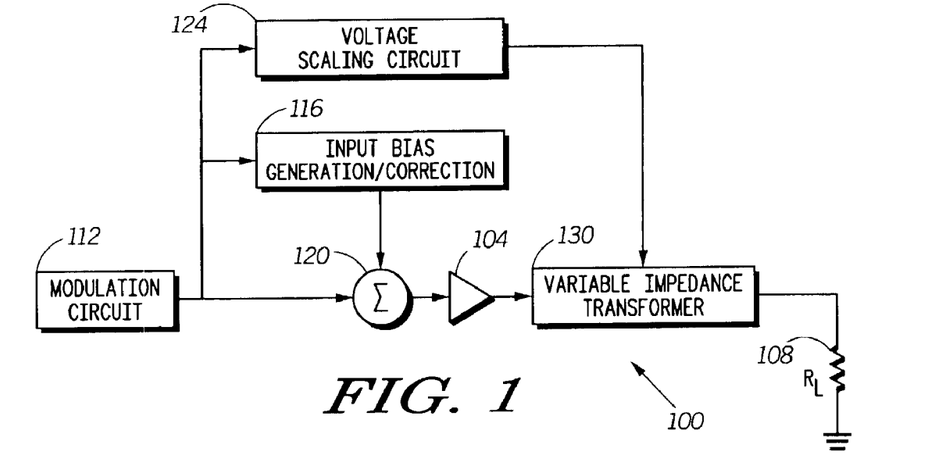
FIG. 1 is a block diagram of a high efficiency amplifier consistent with certain embodiments of the present invention.

Turning now to FIG. 1, a block diagram of an amplifier arrangement 100 consistent with certain embodiments of the present invention is illustrated. In this system, efficiency is enhanced in the power amplifier 104 by modulation of the input bias voltage to the amplifier as well as by maximizing the output of the amplifier 104 while modulating the load 108 on the amplifier to achieve the desired output signal with high efficiency. In amplifier arrangement 100, an input signal to the amplifier 104 is obtained from a modulation circuit 112. This signal is added to a varying DC bias signal from input bias generation/correction circuit 116 at adder 120 (which may be simply a circuit node). A bias correction signal is provided either as an output of the modulation circuit 112 or is derived therefrom. The output of the modulation circuit 112 is further used by a voltage scaling circuit 124 which controls a variable impedance transformer 130.

To fully understand how the present invention functions, first consider the definition of efficiency given by the following relationship for a class B linear amplifier:

$$\text{Efficiency} = \rho = \frac{\overline{P_O}}{\overline{P_S}} \cdot 100\% = \frac{\pi}{4} \frac{V_O}{V_{CC}} \cdot 100\% \quad \text{(Equation 1)}$$

where:
$\overline{P_O}$ is the RF power output,
$\overline{P_S}$ is the DC power supplied,
$V_{CC}$ is the DC supply voltage, and
$V_O$ is the RF output voltage.

As the RF output voltage is reduced in amplitude the DC to RF conversion efficiency is reduced also. For example, a 6 dB reduction in output power or a factor of two reduction in the output voltage results in a factor of two reduction in the efficiency. Thus, it is desirable to keep the amplifier output voltage at its maximum value ($V_O = V_{CC}$), for all output levels, while faithfully reproducing the signal to be amplified from modulation circuit 112. To accomplish this, first examine the output power relation for this circuit:

$$P_O = \frac{V_O^2}{2R_L}, \quad \text{(Equation 2)}$$

where $R_L$ is the load impedance which is varied inversely with the desired output power level to allow the output voltage to remain constant. Setting the output voltage as close to Vcc as possible and constant while varying the load over a wide range, say a 16 to 1 ratio, will keep efficiency constant at or near its peak value of 78.8% (for a class B amplifier). Since the output voltage is constant meaning no amplitude variation is applied, the class of operation can be chosen for efficiency instead of linear performance.

Figure 2:
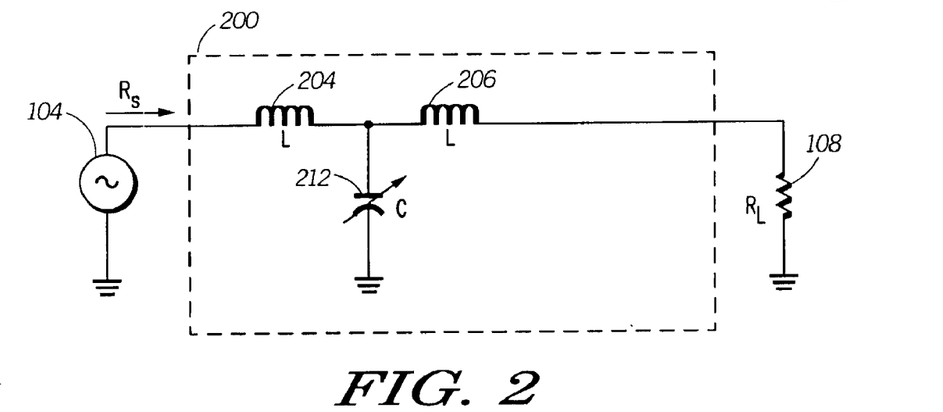
FIG. 2 is a schematic of a fixed lumped element impedance transformer circuit.

In order to effect this manipulation of output impedance load on the amplifier 104, a variable impedance transformer is used to transform the constant load $R_L$ 108 to a modulated load that varies in accordance with the amplifier 104's input signal. To develop such a variable impedance transformer, consider first the fixed quarter wave impedance transformer illustrated as 200 of FIG. 2. This lumped element quarter wavelength transmission line acts as an impedance transformer 200. The transformer 200 is made up of two inductors 204 and 206 in series with capacitor 212 connecting the junctions of inductors 204 and 206 to ground. The inductors have equal value L while the capacitor has value C. The impedance transformer is characterized by the following relationship:

$$R_S = \frac{Z_O^2}{R_L}, \quad \text{(Equation 3)}$$

where $Z_O$ is the transmission line transformer characteristic impedance, $R_S$ is the impedance applied to the voltage source, and $R_L$ is the load to which the RF power is delivered (e.g., an antenna). The values of C and L can be determined from:

$$C = \frac{1}{\omega\sqrt{R_S R_L}} \quad \text{(Equation 4)}$$

and $$L = R_S R_L C \quad \text{(Equation 5)}$$

Transmission line impedance transformer 200 has characteristic impedance $Z_O$ and propagation delay $\alpha$ given by:

$$Z_O = \sqrt{L/C} \quad \text{(Equation 6)}$$

and $$\alpha = \sqrt{L} \quad \text{(Equation 6)}$$

By making the components of impedance transformer 200, variable and electronically controllable, the characteristics of the impedance transformer can be actively controlled to realize a variable load from the perspective of the amplifier 104 while keeping the output voltage at or near the maximum to obtain maximum efficiency and keeping the propagation delay constant. While it is difficult to electronically adjust the value of an inductor at high speed, it is comparatively easy to do so with capacitors. Accordingly, a variable version of impedance transformer 200 is depicted as variable impedance transformer 300 of FIG. 3. In this embodiment, fixed inductors 204 and 206 are replaced with fixed inductors 304 and 306 respectively with variable inductor tuning capacitor (e.g., varactor diode) 314 and 316, respectively, in parallel with the inductors. Fixed capacitor 212 is replaced with variable capacitor 322. When one of the inductor tuning capacitors $C_L$ is adjusted, a desired inductive reactance can be achieved by the following relationships:

$$X_L = \omega L_F \quad \text{(Equation 8)}$$

and $$C_L = \frac{\omega L - X_L}{\omega^2 X_L L}. \quad \text{(Equation 9)}$$

Figure 3:
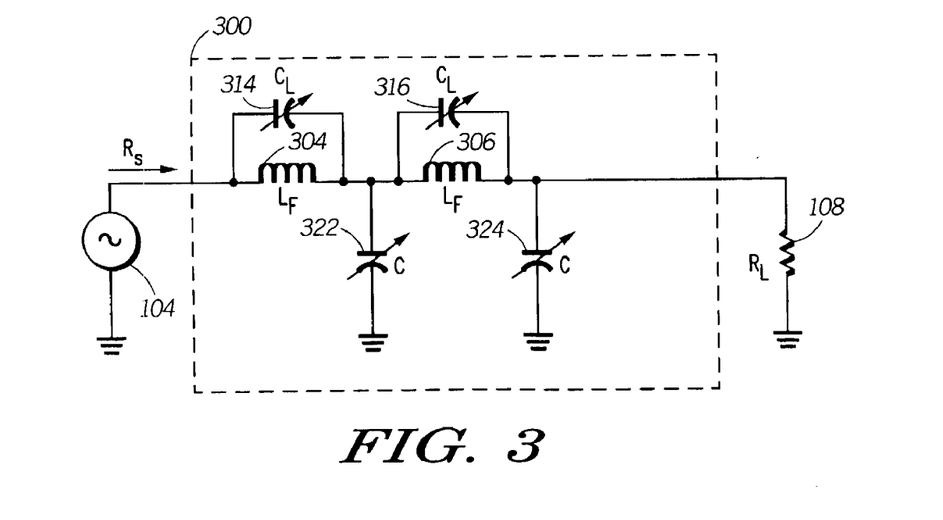
FIG. 3 is a schematic of a variable lumped element impedance transformer consistent with certain embodiments of the present invention.

By way of example and not limitation, the following TABLE 1 shows several combinations of easily realizable component values that vary the characteristic impedance over a range of approximately 4 to 1 in characteristic impedance and approximately 16 to 1 in impedance seen by the amplifier 104 at a frequency of 815 MHz.

TABLE 1

| L (nH) | C (pF) | $L_F$ (nH) | $C_L$ (pF) | $Z_O$ (Ohms) | $R_S$ (RL = 50) |
|---|---|---|---|---|---|
| 6.9 | 5.5 | 3.0 | 7.2 | 35.4 | 25 |
| 13.8 | 2.8 | 3.0 | 10.0 | 70.7 | 100 |
| 19.5 | 2.0 | 3.0 | 10.8 | 100 | 200 |
| 23.9 | 1.6 | 3.0 | 11.1 | 122 | 300 |
| 27.6 | 1.4 | 3.0 | 11.3 | 140.9 | 400 |

The values of C and $C_L$ can be made continuously variable by use of electronically variable capacitor devices such as varactor diodes and controlled by a control voltage to cause the capacitance and reactance values of variable impedance transformer circuit 300 to vary in accordance with the control voltage. This control voltage can be generated in any number of ways so that the control voltage is of an appropriate value for an particular input signal. In one example, the control voltage can be derived directly from a demodulated version of the input voltage. In another example, the control voltage can be generated by the modulation circuitry by either calculating an appropriate voltage, or looking up an appropriate voltage in a lookup table.

Figure 4:
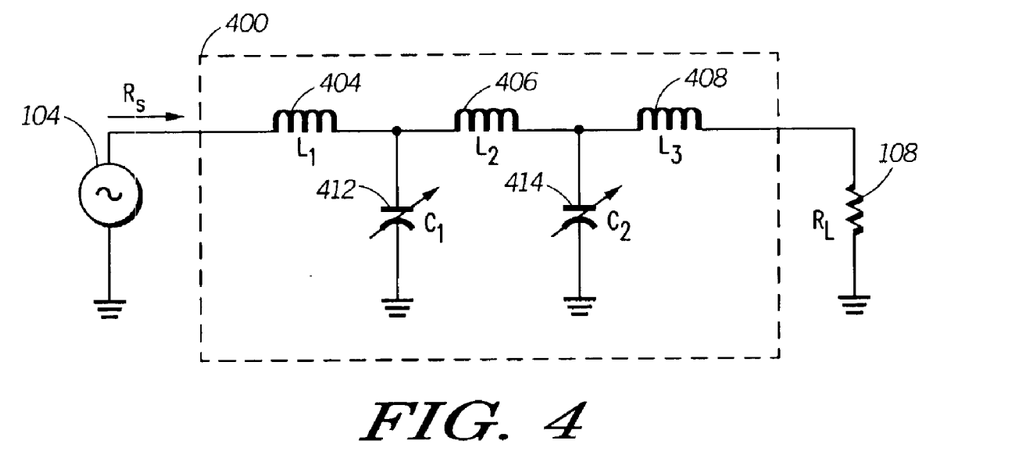
FIG. 4 is a schematic of another fixed lumped element impedance transformer circuit consistent with certain embodiments of the present invention.

The lumped element impedance transformers 200 and 300 shown in FIG. 2 and FIG. 3, respectively, can be implemented in several ways. For example, the "Tee" topology can be replaced with an equivalent "Pi" topology. Also, more Tee or Pi sections may be added to the circuit in order to widen the usable bandwidth. FIG. 4 illustrates such an arrangement with an additional Tee section of impedance transformer 400. With additional sections, there are not unique component values for the inductors and capacitors. One possible set of component values is given by the following relations:

$$Z_O = \sqrt{R_S R_L}, \quad \text{(Equation 10)}$$

$$Z_{O1} = \sqrt{R_S Z_O} \quad \text{(Equation 11)}$$

$$Z_{O2} = \sqrt{R_L Z_O} \quad \text{(Equation 12)}$$

$$C_1 = \frac{1}{\omega Z_{O1}}, \quad \text{(Equation 13)}$$

$$C_2 = \frac{1}{\omega Z_{O2}} \quad \text{(Equation 14)}$$

$$L_1 = \frac{Z_{O1}}{\omega} \quad \text{(Equation 15)}$$

$$L_3 = \frac{Z_{O2}}{\omega} \quad \text{(Equation 16)}$$

$$L_2 = Z_{O1} + Z_{O2}, \quad \text{(Equation 17)}$$

The circuit of FIG. 4 with these component relations will transform load 108, $R_L$ to a value $R_S$ as seen by generator 104 while maintaining a constant phase shift for all transform values. Those skilled in the art will recognize that other circuit topologies, such as Pi sections instead of Tee sections, can perform the same function transformer function.

Figure 5:
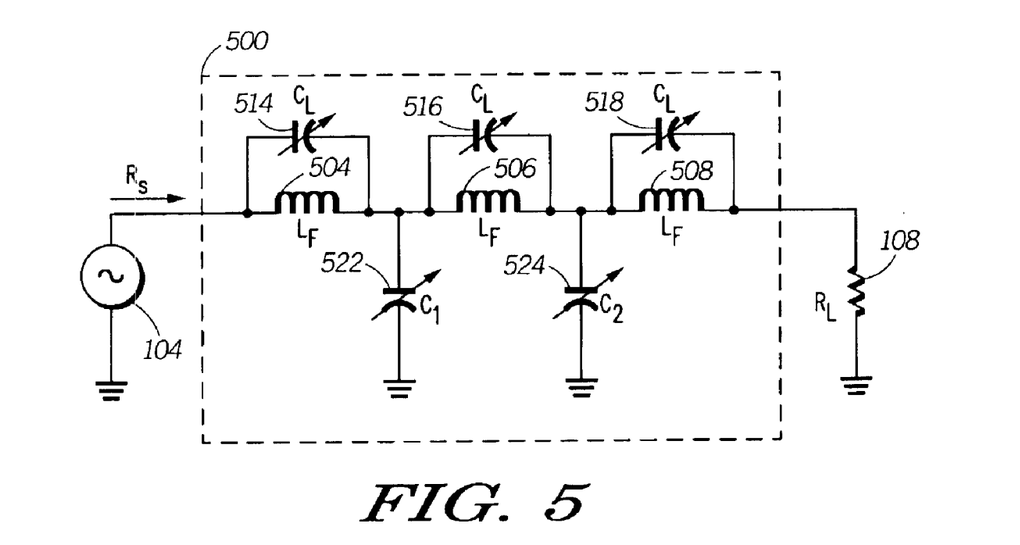
FIG. 5 is a schematic of another variable lumped element impedance transformer consistent with certain embodiments of the present invention.

As was previously shown, the fixed element circuit in FIG. 4 can be made electronically adjustable as shown in the variable impedance transformer 500 of FIG. 5. The fixed capacitors 412 and 414 are replaced by tunable capacitors 522 and 524, respectively. Fixed inductors 404, 406 and 408 are replaced by tunable capacitors 514, 516 and 518, respectively, with each capacitor having a fixed parallel inductor $L_F$, shown as 504, 506, and 508, respectively. The relationships shown in Equations 8 and 9 are used to determine appropriate values for capacitors 514, 516 and 518.

Figure 6:
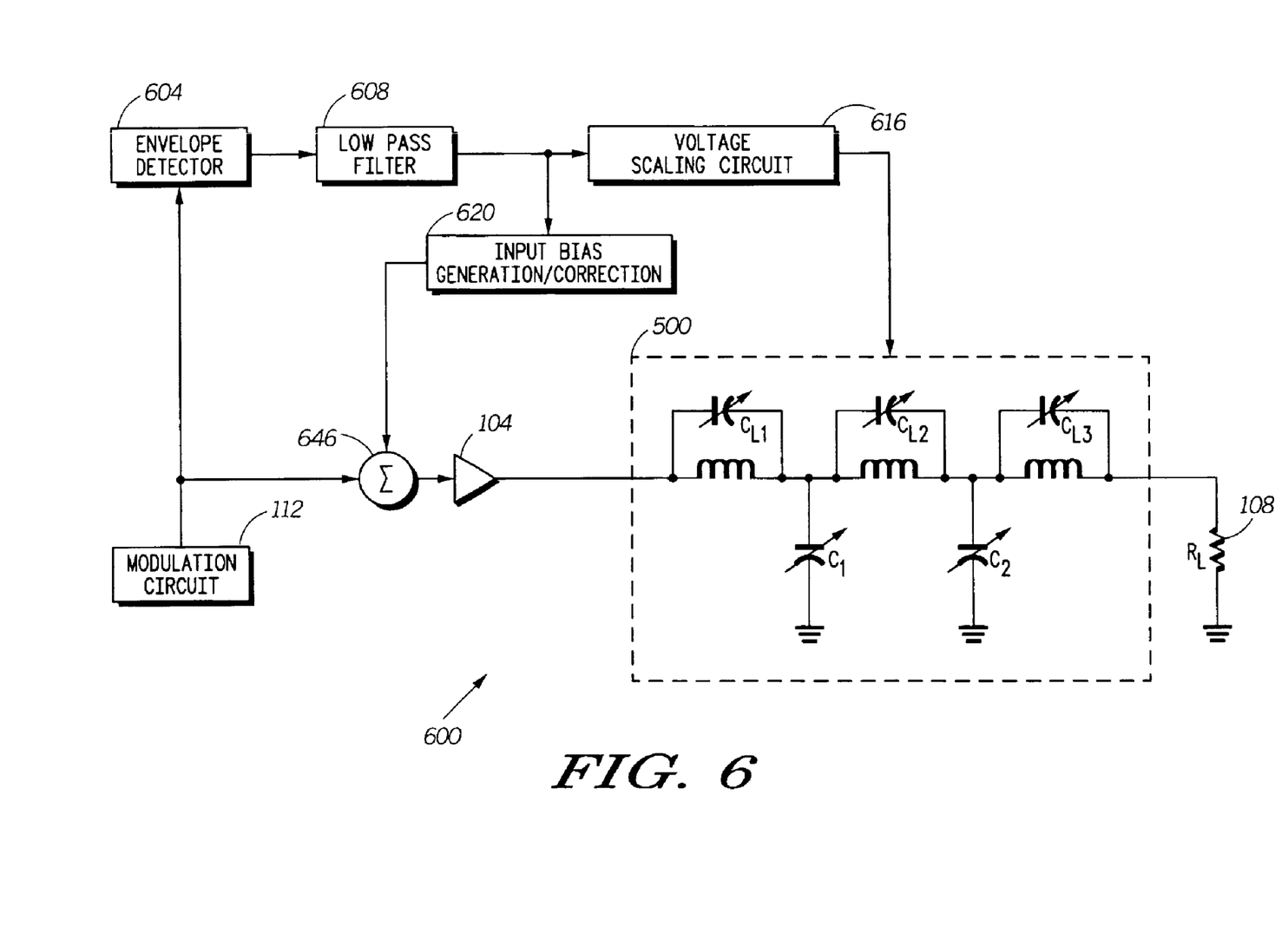
FIG. 6 is a block diagram of a high efficiency RF amplifier consistent with certain embodiments of the present invention.

FIG. 6 illustrates one embodiment of an amplifier circuit 600 in which a variable impedance transformer 500 is utilized to enhance the efficiency of the amplifier circuit 600. In this embodiment, a conventional modulation circuit 112 generates a modulated RF signal for amplification by amplifier 104. Amplifier 104 drives load 108 through variable impedance transformer 500. In this embodiment, an envelope detector 604 receives the output signal from modulation circuit 112 and detects the envelope of the modulated signal in a known manner (e.g., by use of a rectifier circuit). This envelope is low pass filtered by filter 608 to eliminate the high frequency variations at the output of the envelope detector 604 to produce a smooth waveform that follows the envelope of the modulated signal output of the modulation circuit 112. This waveform thus varies as the envelope and can be used to control the values of the capacitors C and $C_L$ in variable impedance transformer 500. In order to assure that the output of low pass filter 608 can provide appropriate drive at appropriate voltage levels, the output of low pass filter 608 is passed to a voltage scaling circuit 616 which may provide any or all of voltage reduction, voltage boost, voltage inversion and buffering to produce one or more control voltages to drive the variable capacitors of variable impedance transformer 500.

In addition to producing the control voltages for varying the variable capacitors of variable impedance transformer 500, the output of low pass filter 608 can be used to generate or correct the input bias of amplifier 104. By assuring that the DC bias of amplifier 104 is optimum, the class of amplification of amplifier 104 can be assured and thus the efficiency maintained. Thus, the output of low pass filter 608 is provided to an input bias generation/correction circuit 620. In certain embodiments, this circuit 620 can generate the entire DC bias used at the input of amplifier 104. In other embodiments, circuit 620 can simply adjust the bias to assure that the class of amplification remains stable for all inputs (and other operating conditions such as temperature and battery voltage). Therefore, other inputs (e.g., supply voltage, input bias voltage, etc.) that are not shown may be provided to circuit 620. The output of circuit 620 is added to the RF input from modulation circuit 112 as shown by adder 646, which may simply represent a circuit node (e.g., the base of an RF junction transistor).

Figure 7:
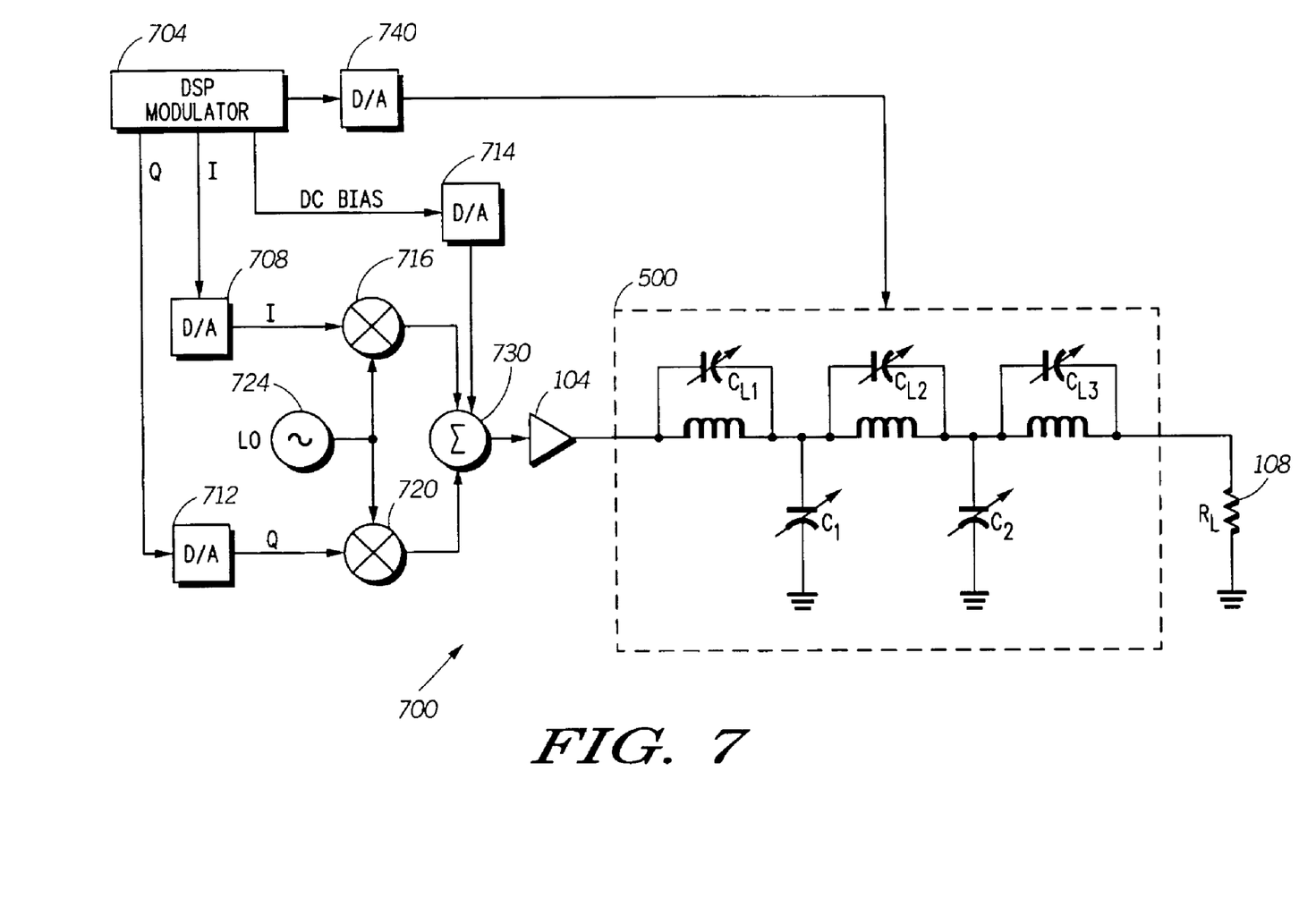
FIG. 7 is a block diagram of another high efficiency RF amplifier consistent with certain embodiments of the present invention.

FIG. 7 shows a second embodiment of a high efficiency amplifier circuit 700 consistent with certain embodiments of the present invention. In this embodiment, amplifier 104 again drives load 108 through variable impedance transformer 500. The input to amplifier and the control and bias voltages are generated using digital techniques in a Digital Signal Processor (DSP) based modulator 704. DSP modulator 704 generates In phase (I), Quadrature (Q), and DC Bias signals by use of digital computations in any suitable manner. These I, Q and DC Bias signals are passed to Digital to Analog (D/A) converters 708, 712, and 714, respectively, for conversion to analog I, Q, and DC Bias signals. These analog I and Q signals are mixed at mixers 716 and 720 with a local oscillator signal from oscillator 724 and then added together with the DC Bias signal at adder 730 to produce the desired input signal at amplifier 104. This input signal can, in accordance with certain embodiments consistent with the present invention, have its AC and DC components compensated to assure that the amplifier 104 operates in the desired class over all operating conditions.

DSP modulator 704, in addition to computing the I and Q and DC Bias values of the modulated signal, further computes values of one or more control signals for controlling the variation of the capacitors in variable impedance transformer 500. This one or more control signals are converted to analog signals (and perhaps buffered if required) by D/A converter 740. In one exemplary embodiment, this computation is facilitated by first fitting a curve for the variation of capacitors C and $C_L$ that is required for a given input signal to an equation. This equation is then repeatedly solved by DSP modulator 704 as the input varies to arrive at values of control voltages needed to control the values of these capacitors over all inputs. A less computationally intense method is illustrated in connection with FIG. 8.

Figure 8:
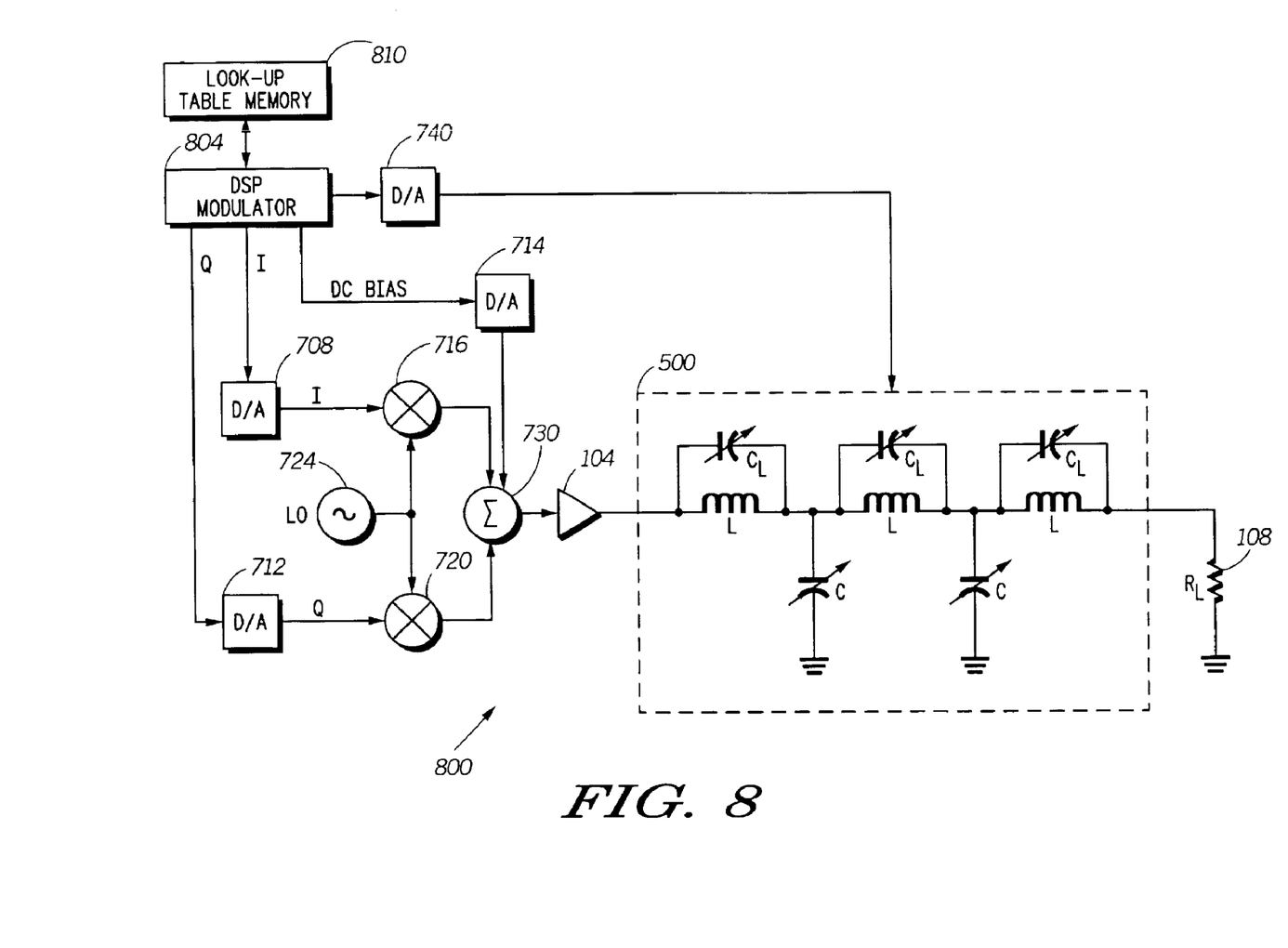
FIG. 8 is a block diagram of another high efficiency RF amplifier consistent with certain embodiments of the present invention.

Referring now to FIG. 8, another embodiment of a high efficiency amplifier circuit 800 consistent with certain embodiments of the present invention is illustrated. In this embodiment, DSP 804 produces the modulated signals I and Q and DC Bias signal as well as the control signals used to adjust the capacitors of variable impedance transformer 500 as previously described. However, the DSP 804 carries out the computation of the control signal for adjusting the capacitors of variable impedance transformer 500 by use of a look-up table 810 stored in memory. Look-up table 810 is indexed by, for example, an input value that is to be provided to amplifier 104 and produces one or more output values for control signals to adjust capacitors C and $C_L$ of variable impedance transformer 500; values for compensating AC and DC levels are also found in look-up table 810. The values stored in look-up table 810 can be derived from, for example, voltage or current to capacitance curves for the variable capacitors C and $C_L$ or by experimentation. In addition, corrections can be added to compensate for operating temperature or other variable parameters as required.

Figure 9:
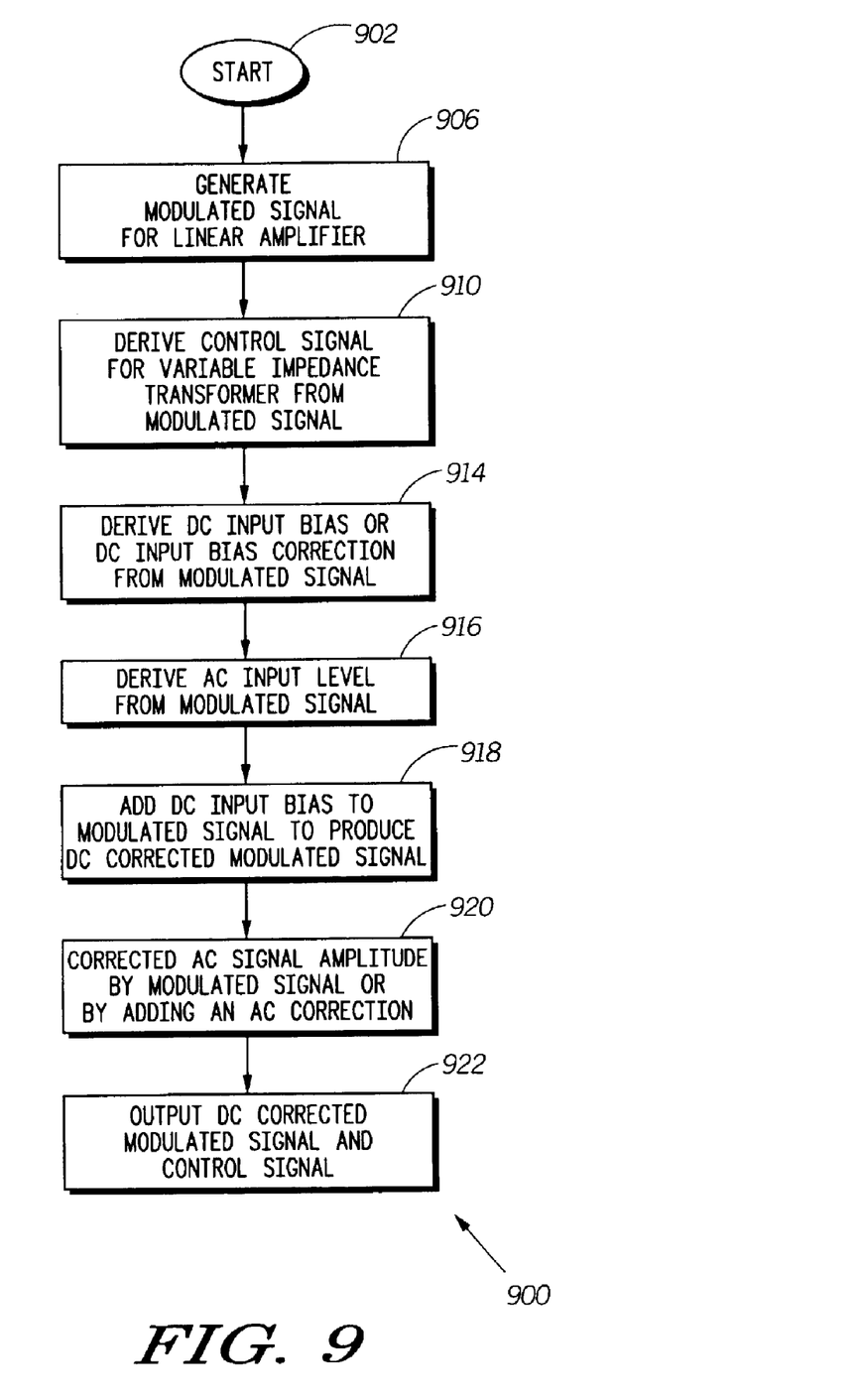
FIG. 9 is a flow chart that describes adjustment of certain high efficiency RF amplifiers consistent with certain embodiments of the present invention.

The processes described above for operation of certain embodiments of high efficiency amplifiers consistent with the present invention can be described by the flow chart 900 of FIG. 9 starting at 902. It should be understood that this is a high level flow chart of the operation of certain embodiments of the invention and many variations are possible without departing from the invention. At 906, a modulated signal is generated to drive the amplifier 104. This modulated signal can be generated using any known analog or digital technique. At 910, a control signal is derived from the modulated signal for control of a variable impedance transformer. This control signal can be derived using analog or digital techniques as described above, or using any other suitable mechanism. If an input bias correction is to be generated, this is done using any suitable analog or digital technique at 914 to assure that the amplifier 104 operates in the proper class over the entire operating range of the input signal. If an AC input level is to be derived, this is done from the modulated signal at 916. If input bias correction is to be used, this input bias correction (or the bias itself) is added to the modulated signal at 918. At 920, the amplitude of the AC signal is corrected by correcting the modulated signal or alternately by adding an AC correction. Block 620 of FIG. 6 generates DC bias and also generates the AC signal to compensate the AC output of Modulation Circuit 112. DSP Modulator 704 of FIG. 7 or DSP Modulator 804 of FIG. 8 scales the amplitude of the Q & I signals. At 922, the modulated signal (or corrected modulated signal) along with the control signal are output at 922 and the process repeats by returning to 906. While this process is depicted as a fully sequential process, the ordering can be rearranged or certain actions carried out in parallel without departing from the invention.

The above exemplary embodiments utilize a variable impedance transformer made up of lumped elements with variable capacitors. Other lumped element circuit arrangements are also possible without departing from the invention. Any type of electronically variable capacitor can be used to realize the variable capacitors of the variable impedance transformer. Additionally, although a lumped element variable impedance transformer is shown in the examples, distributed designs can also be used. For example, striplines transformers with voltage variable dielectric members can be utilized as can distributed designs that use lumped elements as tuning devices. Other variations will occur to those skilled in the art in view of the present discussion.

Thus, a high efficiency amplifier arrangement consistent with certain embodiments of the invention has an amplifier that receives an input signal and amplifies the input signal to produce an output signal that drives a load. A variable impedance transformer is disposed between the amplifier and the load to presents a varying load impedance to the output of the amplifier. A control mechanism, such as a programmed processor, controls the variable impedance transformer with a control signal so that the load impedance seen by the amplifier varies in accordance with an envelope of the input signal. The control signal varies the load impedance in a manner that keeps the output of the amplifier near a peak value. The arrangement may further include a circuit for controlling a DC input bias of the amplifier to keep the amplifier operating within a predetermined class of operation throughout a range of input signals. The control signal may be calculated, looked up in a lookup table or derived from an envelope detector.

A high efficiency amplifier method consistent with certain embodiments of the present invention involves generating a modulated signal as an input to an amplifier, wherein the amplifier drives a load through a variable impedance transformer; deriving a control signal from the modulated signal; and controlling the variable impedance transformer with the control signal.

Those skilled in the art will recognize that certain embodiments of the present invention have been described in terms of exemplary embodiments based upon use of a programmed digital signal processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

Those skilled in the art will also appreciate that the program steps and associated data used to implement the embodiments described above can be implemented using any suitable electronic storage medium such as for example disc storage, Read Only Memory (ROM) devices, Random Access Memory (RAM) devices; optical storage elements, magnetic storage elements, magneto-optical storage elements, flash memory and/or other equivalent storage technologies without departing from the present invention. Such alternative storage devices should be considered equivalents.

Certain embodiments of the present invention, as described in embodiments herein, are implemented using a programmed digital signal processor executing programming instructions that are broadly described above in flow chart form that can be stored on any suitable electronic storage medium (e.g., disc storage, optical storage, semiconductor storage, etc.) or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A high efficiency amplifier arrangement, comprising:
    an amplifier that receives an input signal and amplifies the input signal to produce an output signal that drives a load;
    a variable impedance transformer disposed between the amplifier and the load that presents a varying load impedance to the output of the amplifier; and
    control means for controlling the variable impedance transformer with a control signal so that the load impedance seen by the amplifier varies in accordance with the input signal, wherein the control signal varies with an envelope of the input signal.

2. The apparatus according to claim 1, wherein the control signal varies the load impedance in a manner that keeps the output of the amplifier near a peak value.

3. The apparatus according to claim 1, further comprising means for controlling a DC input bias of the amplifier to keep the amplifier operating within a predetermined class of operation throughout a range of input signals.

4. The apparatus according to claim 1, wherein the variable impedance transformer comprises a variable distributed element impedance transformer.

5. The apparatus according to claim 4, wherein the variable impedance transformer has impedance transformation properties that are varied by adjusting the capacitance of variable capacitors.

6. The apparatus according to claim 4, wherein the variable impedance transformer has impedance transformation properties that are varied by adjusting the properties of a dielectric element.

7. The apparatus according to claim 1, wherein the variable impedance transformer comprises a lumped element impedance transformer with impedance transformation properties that are varied by adjusting the capacitance of variable capacitors.

8. The apparatus according to claim 1, wherein the control means comprises an envelope detector that detects the envelope of the input signal and a scaling circuit that adjusts an output of the envelope detector to produce a control signal therefrom.

9. The apparatus according to claim 1, wherein the control means comprises a programmed processor that determines the control signal.

10. The apparatus according to claim 9, wherein the programmed processor calculates the control signal.

11. The apparatus according to claim 9, wherein the programmed processor looks up the control signal using a lookup table.

12. The apparatus according to claim 9, wherein the programmed processor comprises a digital signal processor.

13. The apparatus according to claim 9, wherein the digital signal processor further comprises a digital modulator and wherein the digital modulator produces the input signal.

14. A high efficiency amplifier arrangement, comprising:
an amplifier that receives an input signal and amplifies the input signal to produce an output signal that drives a load;
a variable impedance transformer disposed between the amplifier and the load that presents a varying load impedance to the output of the amplifier;
an envelope detector that detects an envelope of the input signal; and
a scaling circuit that adjusts an output of the envelope detector to produce a control signal, wherein the variable impedance transformer is controlled with the control signal so that the load impedance seen by the amplifier varies in accordance with an envelope the input signal.

15. The apparatus according to claim 14, wherein the control signal varies the load impedance in a manner that keeps the output of the amplifier near a peak value.

16. The apparatus according to claim 14, further comprising means for controlling a DC input bias of the amplifier to keep the amplifier operating within a predetermined class of operation throughout a range of input signals.

17. A high efficiency amplifier arrangement, comprising:
an amplifier that receives an input signal and amplifies the input signal to produce an output signal that drives a load;
a variable impedance transformer disposed between the amplifier and the load that presents a varying load impedance to the output of the amplifier; and
a programmed processor that controls the variable impedance transformer with a control signal so that the load impedance seen by the amplifier varies in accordance with an envelope of the input signal.

18. The apparatus according to claim 17, wherein the control signal varies the load impedance in a manner that keeps the output of the amplifier near a peak value.

19. The apparatus according to claim 1, further comprising means for controlling a DC input bias of the amplifier to keep the amplifier operating within a predetermined class of operation throughout a range of input signals.

20. The apparatus according to claim 17, wherein the programmed processor calculates the control signal.

21. The apparatus according to claim 17, wherein the programmed processor looks up the control signal using a lookup table.

22. The apparatus according to claim 17, wherein the programmed processor comprises a digital signal processor.

23. The apparatus according to claim 22, wherein the digital signal processor further comprises a digital modulator and wherein the digital modulator produces the input signal.

24. A high efficiency amplifier arrangement, comprising:
an amplifier that receives an input signal and amplifies the input signal to produce an output signal that drives a load;
a digital signal processor based modulator that generates a pair of digital in phase (I) and quadrature (Q) signals;
a pair of analog to digital converters that convert the I and Q signals to analog I and Q signals respectively;
a source of a local oscillator signal;
a pair of mixers that mix the local oscillator signal with the analog I and Q signals respectively to produce a pair of mixed output signals;
an adder that adds the mixed output signals to produce the input signal to the amplifier; and
a variable impedance transformer disposed between the amplifier and the load that presents a varying load impedance to the output of the amplifier,
wherein the digital signal processor controls the variable impedance transformer with a control signal so that the load impedance seen by the amplifier varies in accordance with an envelope of the input signal, and wherein the control signal varies the load impedance in a manner that keeps the output of the amplifier near a peak value.

25. The apparatus according to claim 24, further comprising means for controlling a DC input bias of the amplifier to keep the amplifier operating within a predetermined class of operation throughout a range of input signals.

26. The apparatus according to claim 24, wherein the digital signal processor calculates the control signal.

27. The apparatus according to claim 24, wherein the digital signal processor looks up the control signal using a lookup table.

28. A high efficiency amplifier method, comprising:
generating a modulated signal as an input signal to an amplifier, wherein the amplifier drives a load through a variable impedance transformer;
deriving a control signal from the modulated signal, wherein the control signal varies with an envelope of the input signal; and
controlling the variable impedance transformer with the control signal.

29. The method according to claim 28, further comprising:
deriving a DC input bias signal from the modulated signal; and
applying the DC bias to an input of the amplifier.

30. The method according to claim 28, wherein the control signal varies the variable impedance transformer in a manner such that the load impedance to the amplifier varies to keeps the output of the amplifier near a peak value.

31. The method according to claim 28, wherein the controlling comprises adjusting an electronically variable capacitor.

32. The method according to claim 28, wherein the deriving comprises calculates the control signal using a programmed processor.

33. The method according to claim 28, wherein the deriving comprises a programmed processor looking up the control signal in a lookup table.

34. The method according to claim 28, wherein the deriving comprises detecting the envelope of the input signal and scaling the detected envelope to produce the control signal.

* * * * *